United States Patent
Gono et al.

(10) Patent No.: US 9,558,938 B2
(45) Date of Patent: Jan. 31, 2017

(54) METHOD OF MANUFACTURING NITRIDE SEMICONDUCTOR TEMPLATE

(71) Applicant: Nichia Corporation, Anan-shi, Tokushima (JP)

(72) Inventors: Hideyuki Gono, Anan (JP); Yosuke Shimada, Anan (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 14/867,469

(22) Filed: Sep. 28, 2015

(65) Prior Publication Data
US 2016/0093764 A1    Mar. 31, 2016

(30) Foreign Application Priority Data
Sep. 29, 2014 (JP) ................. 2014-199378

(51) Int. Cl.
| | |
|---|---|
| H01L 33/00 | (2010.01) |
| H01L 21/02 | (2006.01) |
| C30B 25/18 | (2006.01) |
| C30B 29/40 | (2006.01) |

(52) U.S. Cl.
CPC ......... *H01L 21/0242* (2013.01); *C30B 25/186* (2013.01); *C30B 29/403* (2013.01); *H01L 21/0254* (2013.01); *H01L 21/0262* (2013.01); *H01L 21/02458* (2013.01); *H01L 21/02658* (2013.01)

(58) Field of Classification Search
CPC .. H01L 33/0066; H01L 33/0075; H01L 33/32; H01L 21/0242; H01L 21/02458; H01L 21/0254; H01L 21/0262; H01L 21/02658; C30B 25/186; C30B 29/403
USPC ....................................................... 257/103
See application file for complete search history.

(56) References Cited

U.S. PATENT DOCUMENTS

| | | | |
|---|---|---|---|
| 2009/0057646 A1* | 3/2009 | Hirayama | ........... H01L 21/0237 257/13 |
| 2012/0183809 A1 | 7/2012 | Kinoshita et al. | |
| 2015/0357418 A1* | 12/2015 | Lee | .................. H01L 21/02458 257/76 |

FOREIGN PATENT DOCUMENTS

| | | | |
|---|---|---|---|
| JP | 2013-004897 A | | 1/2013 |
| JP | 2013004897 A | * | 1/2013 |
| WO | WO 2011/037251 A1 | | 3/2011 |

\* cited by examiner

*Primary Examiner* — Matthew Gordon
(74) *Attorney, Agent, or Firm* — Foley & Lardner LLP

(57) ABSTRACT

A method of manufacturing a nitride semiconductor template that includes a base substrate of a sapphire substrate and a nitride semiconductor layer represented by a general formula $Al_xGa_{1-x}N$ ($0.3 \leq x \leq 1$) includes: contacting the base substrate with a water vapor atmosphere, nitriding a surface of the base substrate by contacting the base substrate with a nitrogen raw material to form a nitrided area on the surface of the base substrate, and growing a nitride semiconductor layer on the nitrided area.

17 Claims, 2 Drawing Sheets

METHOD OF MANUFACTURING NITRIDE SEMICONDUCTOR TEMPLATE

CROSS-REFERENCE TO RELATED PATENT APPLICATION

The present application claims priority to Japan Patent Application No. 2014-199378 filed Sep. 29, 2014, which is incorporated herein by reference in its entirety.

BACKGROUND

Technical Field

The present disclosure relates to a method of manufacturing a nitride semiconductor template that is obtained by growing a nitride semiconductor layer made of aluminum nitride or the like on a base substrate being a sapphire substrate.

Description of Related Art

A Group III nitride semiconductor made of gallium nitride or the like is a direct transition type compound semiconductor. Because of its wide band gap and the adjustability of the band gap by the proportion of Group III elements in the composition, the Group III nitride semiconductor is typically used as a solid-state light-emitting element to emit visible light or ultraviolet light.

A Group III nitride semiconductor has a melting point significantly higher than that of silicon or the like, so that it is difficult to obtain a bulk single crystal by using a liquid-phase method such as a melt growth method. Accordingly, generally, a single crystal thin film is obtained on a particular substrate (a base substrate) by using a vapor-phase method such as a chemical vapor deposition (CVD) method. Sapphire is typically used as the base substrate.

However, because of a large difference in lattice constant between sapphire and a Group III nitride semiconductor, a nucleus of a Group III nitride semiconductor is not easily formed on a sapphire substrate. As a result, many defects or dislocations appear in the obtained single crystal thin film of a Group III nitride semiconductor. One of methods for reducing such defects or dislocations is to form a thin film of a specific Group III nitride semiconductor as a buffer layer, before forming a thin film of a desired Group III nitride semiconductor. There is also a case in which a Group III nitride semiconductor layer is further formed on the buffer layer, and the layers from the sapphire substrate to the Group III nitride semiconductor layer may be used collectively as a pseudo-Group III nitride semiconductor substrate. Such a pseudo-Group III nitride semiconductor substrate thus obtained may be referred to as a template or the like. There exist various types of templates and various methods of manufacturing the template.

Meanwhile, in forming various types of Group III nitride semiconductors, a specific impurity (dopant) may be introduced according to the purpose. Oxygen may be selected as such an impurity.

WO 2011/037251 A discloses an embodiment in which, an oxygen source gas such as oxygen gas is supplied with other raw material gas, for the purpose of growing a single crystal of a Group III nitride semiconductor that contains a specific concentration of oxygen, on a sapphire substrate.

JP 2013-004897 A discloses an embodiment in which oxygen is used as a dopant that provides n-type conductivity to a Group III nitride semiconductor layer formed on a gallium nitride substrate, and an embodiment in which water vapor in ammonia gas is used as a raw material of the oxygen.

Meanwhile, in some cases, a specific treatment may be performed on the surface of a base substrate, according to the purpose.

Japanese Journal of Applied Physics 52 (2013) 08JB21 discloses that, after nitriding a surface of a sapphire substrate, growing a layer of aluminum nitride on the nitride surface can achieve an aluminum nitride layer with no cracks.

In recent years, a Group III nitride semiconductor is increasingly drawing attention to be used for a solid-state light-emitting element emitting ultraviolet light. A Group III nitride semiconductor used as an active layer in a solid-state light-emitting element to emit ultraviolet light can be aluminum gallium nitride (AlGaN) with a high proportion of aluminum. Accordingly, in the case where ultraviolet light emitted from the active layer is extracted to the substrate side (i.e., a so-called "face-down" structure), the nitride semiconductor layer on the substrate side of the active layer is made of AlGaN (including AlN for the sake of expediency) which contains a higher ratio of aluminum than the active layer.

In recent years, higher performance is increasingly demanded of a solid-state light-emitting element to emit ultraviolet light, and a further improvement is also demanded of a nitride semiconductor template therefor.

SUMMARY

Certain embodiments of the present invention have been made in view of the circumstances described above. An object of certain embodiments of the present invention is to provide a nitride semiconductor template that is suitable for manufacturing a solid-state light-emitting element to emit ultraviolet light.

The inventors have made the present invention as a result of thorough study for achieving the object stated above. The inventors have found that bringing a base substrate into contact with a water vapor atmosphere and then nitriding the surface to form a nitride semiconductor layer using the nitrided area as the main surface, the obtained nitride semiconductor template shows substantially no cloudiness on its upper surface and exhibits sufficiently high crystallinity.

A method of manufacturing a nitride semiconductor template according to an embodiment of the present invention is a method of manufacturing a nitride semiconductor template that includes a base substrate of a sapphire substrate and a nitride semiconductor layer represented by a general formula $Al_xGa_{1-x}N$ ($0.3 \leq x \leq 1$). The method includes contacting the base substrate with a water vapor atmosphere, nitriding a surface of the base substrate by contacting the base substrate with a nitrogen raw material to form a nitrided area on the surface of the base substrate, and growing a nitride semiconductor layer on the nitrided area.

The method of manufacturing a nitride semiconductor template according to this embodiment of the present invention has the features described above; thus, it becomes possible to manufacture a nitride semiconductor template having a nitride semiconductor layer with a high ratio of aluminum, with substantially no cloudiness on its upper surface, and exhibiting high crystallinity. With the use of the nitride semiconductor template obtained in this manner, it becomes possible to manufacture a solid-state light-emitting element of face-down structure that can efficiently emit ultraviolet light.

DETAILED DESCRIPTION OF EMBODIMENT

In the following, a description will be given of an embodiment of a method of manufacturing a nitride semiconductor template according to the present invention. Note that, the present invention is not limited by the following description.

Contacting

Figure 1A:
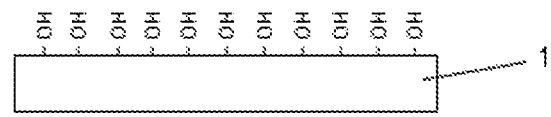
FIGS. 1A to 1C schematically show an exemplary method of manufacturing a nitride semiconductor template according to an embodiment of the present invention.

FIG. 1A schematically shows the present step of connecting. A base substrate 1 is brought into contact with a water vapor atmosphere, and hydroxyl groups are allowed to be chemically adsorbed on the surface of the base substrate 1. In the present specification, the water vapor atmosphere refers to an atmosphere in which the water vapor concentration is 2 µmol/L or more. Though it depends on the type of the base substrate, the contact time, the atmosphere temperature, and the like, the water vapor concentration in the water vapor atmosphere is preferably 5 µmol/L or more, because the hydroxyl groups can be efficiently chemically adsorbed on the surface of the base substrate 1. Too high a water vapor concentration, however, may result in in-plane variations of crystallinity of the uppermost surface (which will be described below) of the obtained nitride semiconductor template, and therefore care should be exercised. In view of the foregoing, the water vapor atmosphere preferably has a water vapor concentration of 10 µmol/L or less.

The base substrate 1 can be made of sapphire that is inexpensive and capable of transmitting light of a wide wavelength range.

Nitriding

Figure 1B:

FIG. 1B schematically shows the present step of nitriding. After allowing hydroxyl groups to be chemically adsorbed on the surface of the base substrate 1, the base substrate 1 is brought into contact with a nitrogen raw material. Thus, the surface of the base substrate 1 is nitrided, and a nitrided area 2 is obtained. Here, though ammonia is used as the nitrogen raw material, it is not limited to ammonia. It is considered that, in the step of nirtiding, the hydroxyl groups adsorbed on the surface of the base substrate 1 in the step of contacting are decomposed, and the atoms of oxygen are introduced into the nitrided area 2, while the atoms of hydrogen are discharged to the outside of the system.

Note that, before performing the step of contacting and/or the step of nitiriding, a step of thermally cleaning the entire base substrate 1 may be performed.

Through the step of contacting step and the step of nitiriding, the nitrided area 2 can be provided in a state that is suitable for forming a nitride semiconductor layer with a high ratio of aluminum and good crystal quality.

Growing

Figure 1C:
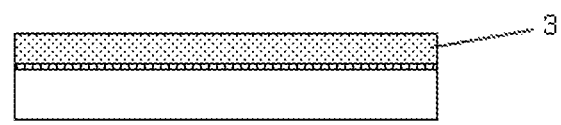

FIG. 1C schematically shows the present step of growing. The uppermost surface of the nitrided area 2 serves as the main surface of the base substrate. On this main surface, a nitride semiconductor layer 3 of an intended composition is formed. The composition of the nitride semiconductor layer 3 may be appropriately selected according to the type of the nitride semiconductor light-emitting element to obtain.

The method of forming the nitride semiconductor layer 3 may be appropriately selected from known vapor-phase methods according to the purpose. Examples of such a method include, for example, a metal organic chemical vapor deposition (MOCVD) method, a physical vapor deposition (PVD) method, a hydride vapor phase epitaxy (HVPE) method, and a molecular beam epitaxy (MBE) method.

In this manner, the intended nitride semiconductor template can be obtained. The uppermost surface of the nitride semiconductor layer 3 serves as the uppermost surface of the nitride semiconductor template. The nitride semiconductor layer 3 is preferably formed through the steps described below because the crystal quality can be further improved. The more preferred mode of the step of growing will be described below.

Figure 2A:
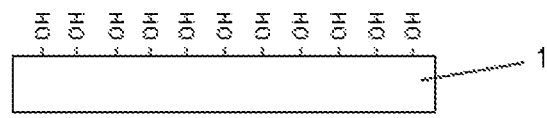
FIGS. 2A to 2D schematically show another exemplary method of manufacturing the nitride semiconductor template according to an embodiment of the present invention.
Figure 2B:

FIGS. 2A to 2D schematically show an exemplary more preferred mode of the method of manufacturing the nitride semiconductor template of the present invention. FIGS. 2A and 2B correspond to FIGS. 1A and 1B, respectively. In the mode shown in FIGS. 2A to 2D, the step of growing includes a first growing and a second growing.

First Growing

Figure 2C:
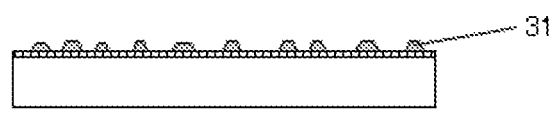

FIG. 2C schematically shows the present step of first growing included in the step of growing. Through the present step of first growing, a first nitride semiconductor layer 31 is formed on the main surface of the base substrate. The first nitride semiconductor layer 31 is made of a group of crystal nucleuses each having approximately frustum shape. In FIG. 2C, the individual crystal nucleuses are spaced apart from each other, but some crystal nucleuses may be in contact with each other, as long as at least a portion of an inclined surface of each crystal nucleus is exposed. In the present specification, such a group of the crystal nucleuses is regarded as a "layer" for the sake of convenience, and is defined as the first nitride semiconductor layer.

The first nitride semiconductor layer 31 can be obtained by preferentially growing the crystal in a normal direction (a perpendicular direction) on the main surface. The crystal growth in the perpendicular direction can be achieved by increasing the ratio $V_1(N)/V_1(M)$ between a raw material supply velocity $V_1(N)$ of nitrogen and a raw material supply velocity $V_1(M)$ of an element M other than nitrogen, or lowering the temperature in the reactor. By forming a second nitride semiconductor layer which will be described below, so as to be in contact with the upper surface of the obtained first nitride semiconductor layer 31, cracks are unlikely to occur in the obtained second nitride semiconductor layer.

With a smaller value of $V_1(N)/V_1(M)$, stable formation of the first nitride semiconductor layer 31 can be facilitated. Accordingly, the temperature in the reactor is preferably lowered according to $V_1(N)/V_1(M)$ so that the crystal growth in the perpendicular direction can be promoted. Preferable conditions in the step of first growing may be $V_1(N)/V_1(M)$ of 10 to 200 and the temperature in the reactor of 800° C. to 1100° C.

Second Growing

Figure 2D:
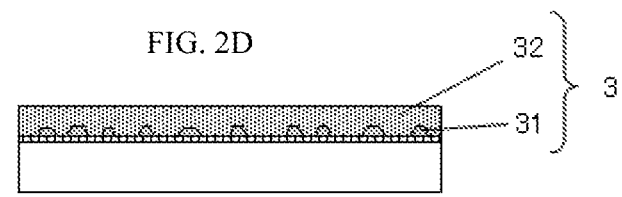

FIG. 2D schematically shows the present step of second growing included in the growth step. A second nitride semiconductor layer 32 of an objective composition is formed on the first nitride semiconductor layer 31 that has been formed. As shown in FIG. 2D, the second nitride semiconductor layer 32 is in contact with the upper surface of the first nitride semiconductor layer 31. The uppermost surface of the second nitride semiconductor layer 32 is approximately flat. The first nitride semiconductor layer 31 and the second nitride semiconductor layer 32 are collectively referred to as the nitride semiconductor layer 3.

The composition of the first nitride semiconductor layer 31 and the composition of the second nitride semiconductor layer 32 may either be identical to or different from each other. Also, the method of forming in the step of first growing and in the step of second growing may either be identical to or different from each other.

The second nitride semiconductor layer 32 can be obtained by preferentially growing the crystal in the direction along the main surface (a lateral direction). The crystal growth in the lateraldirection is achieved by reducing the ratio $V_2(N)/V_2(M)$ between a raw material supply velocity $V_2(N)$ of nitrogen and a raw material supply velocity $V_2(M)$ of the element M other than nitrogen, or raising the temperature in the reactor.

The second nitride semiconductor layer 32 is likely to be stably formed when $V_1(N)/V_1(M)$ is larger. Accordingly, the temperature in the reactor is preferably raised according to $V_1(N)/V_1(M)$ so that the crystal growth in the lateral direction can be promoted. Preferable conditions in the step of second growing may be $V_1(N)/V_1(M)$ of 200 to 2500 and the temperature in the reactor of 1200° C. to 1500° C.

Irrespective of the mode of the step of growing, the average composition of the nitride semiconductor layer 3 is represented by a general formula $Al_xGa_{1-x}N$ ($0.3 \leq x \leq 1$).

Post-Treating

After the nitride semiconductor layer 3 is formed, the inside of the reactor is cooled as appropriate and the intended nitride semiconductor template is obtained. A post-treating may be performed before cooling the inside of the reactor, during cooling the inside of the reactor, or after cooling the inside of the reactor according to the purpose.

More specific description will be given below, referring to Examples.

Example 1

Contacting

The reactor under a normal pressure was filled with nitrogen gas whose water vapor concentration was 5 μmol/L. As the base substrate, a sapphire substrate whose diameter was about 7.6 cm (3 inches) was placed on a tray in the reactor with its C-plane facing up, and brought into contact with water vapor in the reactor for 10 minutes. During the step of contacting, the inside of the reactor was maintained at a normal temperature.

Thermally Cleaning

After the step of contacting, the atmosphere inside the reactor was replaced by nitrogen. After the replacement, the reactor was adjusted so that the temperature of the tray became 1200° C. After the adjustment, hydrogen gas and nitrogen gas were continuously supplied to the reactor for 30 minutes at the flow rate of 0.31 mol/min (7 slm) and 0.13 mol/min (3 slm), respectively. Thus, the sapphire substrate was thermally cleaned.

Nitiriding

After the step of thermally cleaning, the pressure in the reactor was reduced, and the reactor was adjusted so that the temperature of the tray became 1100° C. After the adjustment, hydrogen gas, nitrogen gas and ammonia gas were continuously supplied to the reactor for 30 minutes at the flow rate of 0.76 mol/min (17 slm), 0.18 mol/min (4 slm), and 1300 μmol/min, respectively. Thus, the surface of the sapphire substrate was nitrided, and a nitrided area was formed.

Growing

First Growing

After the step of nitiriding, hydrogen gas, nitrogen gas, ammonia gas, and trimethylaluminium (TMA) gas were continuously supplied to the reactor for 30 minutes at the flow rate of 0.76 mol/min (17 slm), 0.18 mol/min (4 slm), 1300 μmol/min, and 53 μmol/min, respectively. On the nitrided area, a first nitride semiconductor layer made of aluminum nitride was formed.

Second Growing

After the first nitride semiconductor layer was formed, the supply of ammonia gas and TMA gas was stopped, and the reactor was adjusted so that the temperature of the tray became 1400° C. After the adjustment, nitrogen gas, hydrogen gas, ammonia gas, and TMA gas were continuously supplied for 300 minutes at the flow rate of 0.16 mol/min (3.5 slm), 0.67 mol/min (15 slm), 5400 μmol/min, and 21 μmol/min, respectively. On the first nitride semiconductor layer, a second nitride semiconductor layer made of aluminum nitride was formed.

Post-Treating

After the step of second growing, the supply of TMA gas was stopped, and the pressure in the reactor was returned to a normal pressure. The reactor was adjusted so that the temperature of the tray became 400° C. After the adjustment, the supply of hydrogen gas and ammonia gas was stopped, and the atmosphere inside the reactor was replaced by nitrogen gas. After the replacement, the reactor was adjusted so that the atmosphere in the reactor became a normal temperature, to obtain the intended nitride semiconductor template.

Example 2

A nitride semiconductor template was obtained in the same manner as in Example 1 except that nitrogen gas whose water vapor concentration was 10 μmol/L was used in the step of contacting.

Comparative Example 1

A nitride semiconductor template was obtained in the same manner as in Example 1 except that the contact step was omitted.

Comparative Example 2

A nitride semiconductor template was obtained in the same manner as in Example 1 except that nitrogen whose oxygen concentration was 5 μmol/L was used in the contact step.

Evaluation of Nitride Semiconductor Templates

The uppermost surface of each of the nitride semiconductor templates obtained by Examples 1 and 2 and Comparative Examples 1 and 2 was evaluated. The evaluation was performed at the center of the uppermost surface (p1) and at the point 10 mm inner from the outer circumference of the uppermost surface (p2).

Crystallinity Evaluation

The crystallinity in the (002) plane direction was measured by an X-ray rocking curve method, and the crystallinity was evaluated by the value of full width at half maximum (FWHM).

Surface State Evaluation

The uppermost surface was observed by an optical microscope, and the presence or absence of cloudiness was checked.

The manufacturing conditions of Examples 1 and 2 and Comparative Examples 1 and 2 are shown in Tables 1 to 3, and the evaluation result is shown in Table 4.

TABLE 1

| | Atmosphere | Concentration μmol/min$^{-1}$* | Thermally Cleaning | | | Nitriding | | | |
|---|---|---|---|---|---|---|---|---|---|
| | | | Temperature/° C. | H$_2$/mol · min$^{-1}$ | N$_2$/mol · min$^{-1}$ | Temperature/° C. | H$_2$/mol · min$^{-1}$ | N$_2$/mol · min$^{-1}$ | NH$_3$/μ mol · min$^{-1}$ |
| Example 1 | H$_2$O | 5 | 1200 | 0.31 | 0.13 | 1100 | 0.76 | 0.18 | 1300 |
| Example 2 | | 10 | | | | | | | |
| Comparative Example 1 | — | — | | | | | | | |
| Comparative Example 2 | O$_2$ | 10 | | | | | | | |

*as oxygen

TABLE 2

| | First Growing | | | | | |
|---|---|---|---|---|---|---|
| | Temperature/° C. | H$_2$/mol · min$^{-1}$ | N$_2$/mol · min$^{-1}$ | NH$_3$/μ mol · min$^{-1}$ | TMA/μ mol · min$^{-1}$ | Time/min |
| Example 1 | 1100 | 0.76 | 0.18 | 1300 | 53 | 20 |
| Example 2 | | | | | | |
| Comparative Example 1 | | | | | | |
| Comparative Example 2 | | | | | | |

TABLE 3

| | Second Growing | | | | | |
|---|---|---|---|---|---|---|
| | Temperature/° C. | H$_2$/mol · min$^{-1}$ | N$_2$/mol · min$^{-1}$ | NH$_3$/μ mol · min$^{-1}$ | TMA/μ mol · min$^{-1}$ | Time/min |
| Example 1 | 1400 | 0.16 | 0.67 | 5400 | 21 | 300 |
| Example 2 | | | | | | |
| Comparative Example 1 | | | | | | |
| Comparative Example 2 | | | | | | |

TABLE 4

| | FWHM (002)/arcsec | | State of uppermost surface* | |
|---|---|---|---|---|
| | p1 | p2 | p1 | p2 |
| Example 1 | 32 | 37 | ○ | ○ |
| Example 2 | 38 | 72 | ○ | ○ |
| Comparative Example 1 | — | — | x | x |
| Comparative Example 2 | — | — | x | x | p1: the center of the uppermost surface
p1: 10 mm inner than the outer circumference of the uppermost surface
*○: no cloudiness; x cloudiness present From Tables 1 to 4, the following can be found.

When the water vapor atmosphere is not used in the step of contacting, cloudiness appears at the uppermost surface of the obtained nitride semiconductor template. It cannot be expected that a solid-state light-emitting element that emits ultraviolet light with high emission efficiency can be obtained from such nitride semiconductor templates (Comparative Examples 1 and 2). On the other hand, when the water vapor atmosphere is used in the step of contacting, no cloudiness appears at the uppermost surface of the obtained nitride semiconductor template. Further, FWHM (002) of the uppermost surface is significantly lower than 100 arcsec, and the crystallinity is sufficient for manufacturing a solid-state light-emitting element to emit ultraviolet light. When the water vapor concentration in the water vapor atmosphere is high, FWHM (102) near the outer periphery of the uppermost surface may become high. Accordingly, the water vapor concentration is preferably 10 µmol/L or less (Examples 1 and 2).

The method of manufacturing a nitride semiconductor template according to the present invention makes it possible to manufacture a nitride semiconductor template suitable for a solid-state light-emitting element of the face-down structure that is configured to emit ultraviolet light. A solid-state light-emitting element obtained by using the obtained nitride semiconductor template can be suitably used for a germicidal lamp, a light source for lithography, and the like.

Although the foregoing refers to particular preferred embodiments, it will be understood that the disclosure is not so limited. Various modifications may be made to the disclosed embodiments and that such modifications are intended to be within the scope of the disclosure. All of the publications, patent applications and patents cited herein are incorporated herein by reference in their entirety.

What is claimed is:

1. A method of manufacturing a nitride semiconductor template including a base substrate comprising a sapphire substrate and a nitride semiconductor layer represented by a general formula $Al_xGa_{1-x}N$ ($0.3 \leq x \leq 1$), the method comprising:
    contacting the base substrate with a water vapor atmosphere, wherein a water vapor concentration in the water vapor atmosphere is in a range of 5 µmol/L to 10 µmol/L;
    nitriding a surface of the base substrate by contacting the base substrate with a nitrogen raw material to form a nitrided area on a surface of the base substrate; and
    forming a first nitride semiconductor layer on the nitride area, the first nitride semiconductor layer being made of a group of crystal nucleuses each having an approximately frustum shape, and
    forming a second nitride semiconductor layer in contact with an upper surface of the first nitride semiconductor layer, the second nitride semiconductor layer having an approximately flat uppermost surface.

2. The method of manufacturing according to claim 1, wherein, in the step of forming the first nitride semiconductor layer, a ratio $V_1(N)/V_1(M)$ between a raw material supply velocity $V_1(N)$ of nitrogen in the first nitride semiconductor layer and a raw material supply velocity $V_1(M)$ of an element M other than nitrogen is 10 to 200, and a temperature in a reactor used during forming the first nitride semiconductor layer is 800° C. to 1100° C.

3. The method of manufacturing according to claim 1, wherein, in the step of forming the second nitride semiconductor layer, a ratio $V_2(N)/V_2(M)$ between a raw material supply velocity $V_2(N)$ of nitrogen in the second nitride semiconductor layer and a raw material supply velocity $V_2(M)$ of an element M other than nitrogen is 200 to 2500, and a temperature in a reactor used during forming the second nitride semiconductor layer is 1200° C. to 1500° C.

4. The method of manufacturing according to claim 2, wherein, in the step of forming the second nitride semiconductor layer, a ratio $V_2(N)/V_2(M)$ between a raw material supply velocity $V_2(N)$ of nitrogen in the second nitride semiconductor layer and a raw material supply velocity $V_2(M)$ of an element M other than nitrogen is 200 to 2500, and a temperature in a reactor used during forming the second nitride semiconductor layer is 1200° C. to 1500° C.

5. The method of manufacturing according to claim 1, wherein the first nitride semiconductor layer is made of aluminum nitride.

6. The method of manufacturing according to claim 2, wherein the first nitride semiconductor layer is made of aluminum nitride.

7. The method of manufacturing according to claim 3, wherein the first nitride semiconductor layer is made of aluminum nitride.

8. The method of manufacturing according to claim 4, wherein the first nitride semiconductor layer is made of aluminum nitride.

9. The method of manufacturing according to claim 1, wherein the second nitride semiconductor layer is made of aluminum nitride.

10. The method of manufacturing according to claim 2, wherein the second nitride semiconductor layer is made of aluminum nitride.

11. The method of manufacturing according to claim 3, wherein the second nitride semiconductor layer is made of aluminum nitride.

12. The method of manufacturing according to claim 4, wherein the second nitride semiconductor layer is made of aluminum nitride.

13. The method of manufacturing according to claim 5, wherein the second nitride semiconductor layer is made of aluminum nitride.

14. The method of manufacturing according to claim 6, wherein the second nitride semiconductor layer is made of aluminum nitride.

15. The method of manufacturing according to claim 7, wherein the second nitride semiconductor layer is made of aluminum nitride.

16. The method of manufacturing according to claim 8, wherein the second nitride semiconductor layer is made of aluminum nitride.

17. A nitride semiconductor template for a solid-state light-emitting element manufactured by the method of manufacturing according to claim 1.

* * * * *